United States Patent
Miyazawa

(10) Patent No.: US 8,651,629 B2
(45) Date of Patent: Feb. 18, 2014

(54) PIEZOELECTRIC ELEMENT, LIQUID-EJECTING HEAD, AND LIQUID-EJECTING APPARATUS

(71) Applicant: Seiko Epson Corporation, Tokyo (JP)

(72) Inventor: Hiromu Miyazawa, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/737,522

(22) Filed: Jan. 9, 2013

(65) Prior Publication Data

US 2013/0127954 A1 May 23, 2013

Related U.S. Application Data

(63) Continuation of application No. 13/100,348, filed on May 4, 2011, now Pat. No. 8,371,681.

(30) Foreign Application Priority Data

May 7, 2010 (JP) ................ 2010-107740

(51) Int. Cl.
- *B41J 2/045* (2006.01)
- *C04B 35/495* (2006.01)
- *H01L 41/18* (2006.01)
- *H01L 41/187* (2006.01)
- *C04B 35/00* (2006.01)

(52) U.S. Cl.
USPC ............... 347/68; 252/62.9 R; 252/62.9 PZ; 310/311

(58) Field of Classification Search
USPC .................. 347/68; 252/62.9 R, 62.9 PZ
See application file for complete search history.

(56) References Cited

U.S. PATENT DOCUMENTS

| 8,371,681 B2 * | 2/2013 | Miyazawa ........... 347/68 |
| 2008/0239017 A1 * | 10/2008 | Takabe et al. ........... 347/68 |
| 2010/0231095 A1 * | 9/2010 | Kubota et al. ............ 310/357 |

FOREIGN PATENT DOCUMENTS

| JP | 2001-223404 | 8/2001 |
| SU | 526605 | 10/1976 |

OTHER PUBLICATIONS

U.S. Appl. No. 13/100,348, Oct. 10, 2012, Notice of Allowance.

* cited by examiner

*Primary Examiner* — Lisa M Solomon
(74) *Attorney, Agent, or Firm* — Workman Nydegger

(57) ABSTRACT

A piezoelectric element includes a piezoelectric layer and electrodes provided to the piezoelectric layer. The piezoelectric layer consists of a complex oxide containing bismuth, cerium, iron and cobalt and the molar ratio of cobalt to the total of iron and cobalt is 0.125 or more and 0.875 or less.

8 Claims, 10 Drawing Sheets

BiFeO₃

Bi DEFICIENCY

BiCeFeO$_3$

○ B-SITE TRANSITION METAL
◍ OXYGEN

PIEZOELECTRIC ELEMENT, LIQUID-EJECTING HEAD, AND LIQUID-EJECTING APPARATUS

CROSS-REFERENCE TO RELATED APPLICATIONS

This application is a Continuation of U.S. application Ser. No. 13/100,348 filed May 4, 2011 which claims the benefit of priority to Japanese Patent Application No. 2010-107740 filed May 7, 2010, the contents of which are hereby incorporated by reference in their entirety.

BACKGROUND

1. Technical Field

The present invention relates to a liquid ejecting head including a piezoelectric element that causes a change in pressure in a pressure-generating chamber communicating with a nozzle opening and has a piezoelectric layer and electrodes for applying a pressure to the piezoelectric layer, and relates to a liquid ejecting apparatus and a piezoelectric element.

2. Related Art

In some of piezoelectric actuators used in liquid ejecting heads, a piezoelectric element having a structure in which a piezoelectric layer made of a piezoelectric material, for example, a crystallized dielectric material, exhibiting an electromechanical conversion function is disposed between two electrodes is used. A typical example of the liquid ejecting head is an ink jet recording head in which a diaphragm configures a part of a pressure-generating chamber communicating with a nozzle opening for discharging ink droplets and a pressure is applied to the ink in the pressure-generating chamber by deforming the diaphragm by a piezoelectric element to discharge the ink as droplets from the nozzle opening.

The piezoelectric material used as the piezoelectric layer (piezoelectric ceramic) configuring such a piezoelectric element is required to have a high piezoelectric property, and typical examples of such piezoelectric material include lead zirconate titanate (PZT) (see JP-A-2001-223404).

However, from the viewpoint of an environmental problem, there is a demand for a piezoelectric material having a less content of lead. As an example of the piezoelectric material not containing lead, $BiFeO_3$ having a perovskite structure shown by $ABO_3$ is known, but the $BiFeO_3$ system piezoelectric material has low insulation and, therefore, has a problem of easily causing a leakage current. Accordingly, there is a problem that it is difficult to apply the material to liquid ejecting heads. In addition, the amount of deflection is small, compared to that of PZT. Accordingly, there is a demand for a piezoelectric material giving a large amount of deflection and having an excellent piezoelectric property.

These problems are not only of ink jet recording heads, of cause, but also of other liquid ejecting heads for discharging droplets other than ink. In addition, these problems are of piezoelectric elements that are used for devices other than liquid ejecting heads.

SUMMARY

An advantage of some aspects of the invention is to provide a liquid ejecting head, a liquid ejecting apparatus, and a piezoelectric element that are reduced in environmental loads, leakage currents in which are prevented, and have excellent piezoelectric properties.

An aspect of the invention for solving the above-mentioned problems is a liquid ejecting head including a pressure-generating chamber communicating with a nozzle opening and a piezoelectric element having a piezoelectric layer and electrodes provided to the piezoelectric layer, wherein the piezoelectric layer is configured of a complex oxide having a perovskite structure containing bismuth, cerium, iron, and cobalt so that the molar ratio of cobalt to the total of iron and cobalt is 0.125 or more and 0.875 or less.

In this aspect, a leakage current is prevented, and an excellent piezoelectric property is provided. In addition, since lead is not contained, environmental loads can be reduced.

In a preferred aspect of the invention, the bismuth and the cerium are contained in the A site, and the iron and cobalt are contained in the B site.

In another preferred aspect of the invention, the complex oxide is represented by the following general formula:

$$(Bi_{1-x}Ce_{3x/4})(Co_{1-\delta}Fe_{\delta})O_3 \qquad (1)$$

The piezoelectric layer preferably has a monoclinic crystalline structure. By doing so, a more excellent piezoelectric property can be obtained.

The complex oxide may further contain lanthanum. The complex oxide preferably contains lanthanum at a molar ratio of 0.05 or more and 0.20 or less with respect to the total of bismuth, cerium, and lanthanum.

Another aspect of the invention is a liquid ejecting apparatus including the above-described liquid ejecting head according to an aspect of the invention.

In this aspect, a liquid ejecting apparatus, the leakage current in which is prevented and the piezoelectric property of which is excellent, can be realized. In addition, since lead is not contained, environmental loads can be reduced.

Another aspect of the invention is a piezoelectric element including a piezoelectric layer and electrodes provided to the piezoelectric layer, wherein the piezoelectric layer is configured of a complex oxide having a perovskite structure containing bismuth, cerium, iron, and cobalt so that the molar ratio of cobalt to the total of iron and cobalt is 0.125 or more and 0.875 or less.

In this aspect, a piezoelectric element, the leakage current in which is prevented and the piezoelectric property of which is excellent, can be realized. In addition, since lead is not contained, environmental loads can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
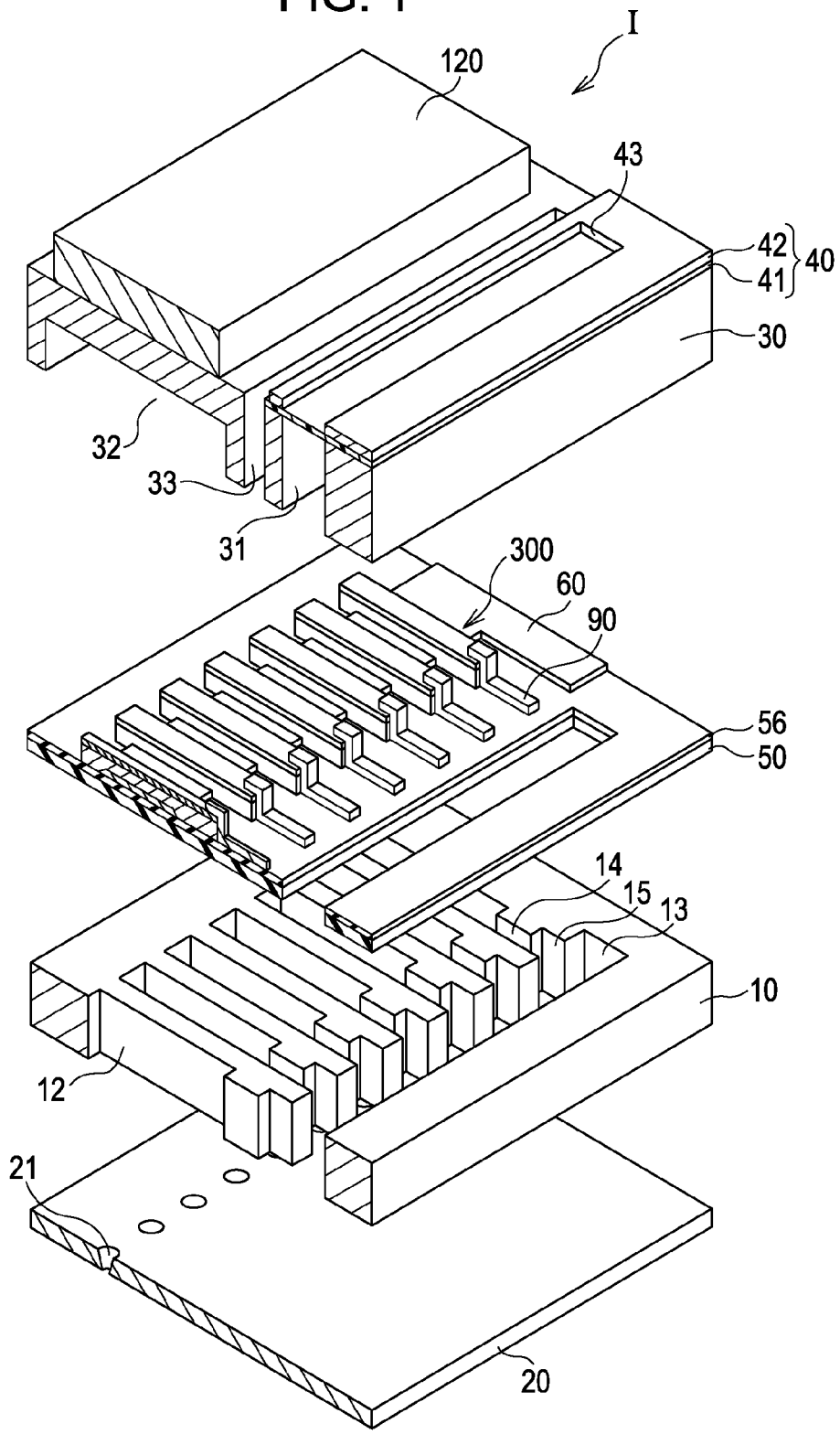
FIG. 1 is an exploded perspective view of schematically illustrating the constitution of a recording head according to Embodiment 1.
Figure 2:
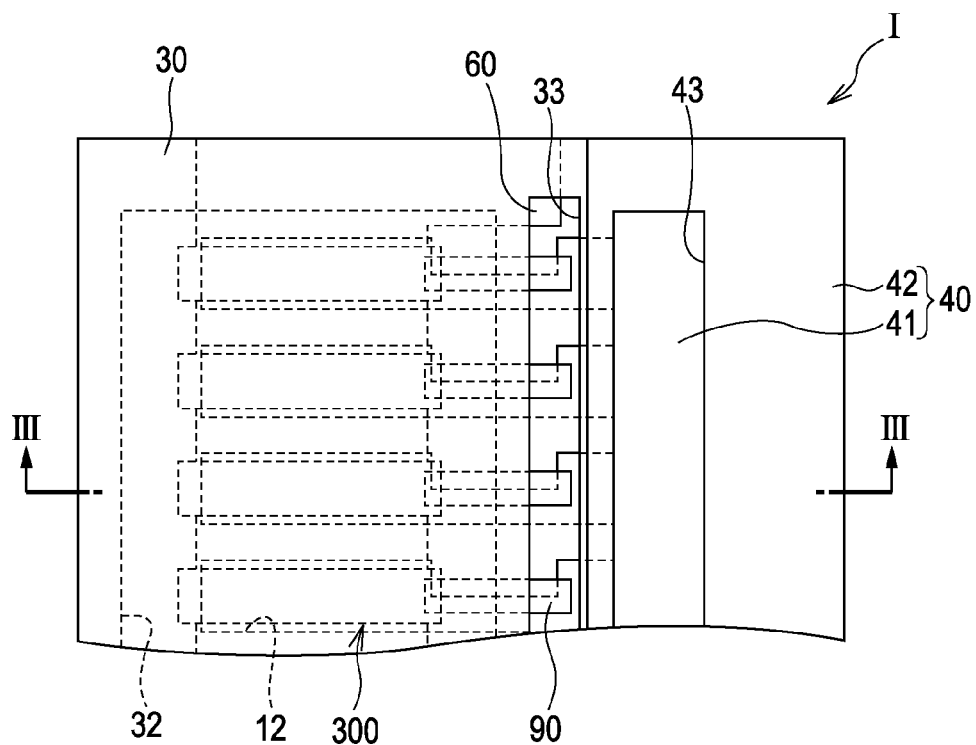
FIG. 2 is a plan view of the recording head according to Embodiment 1.
Figure 3:
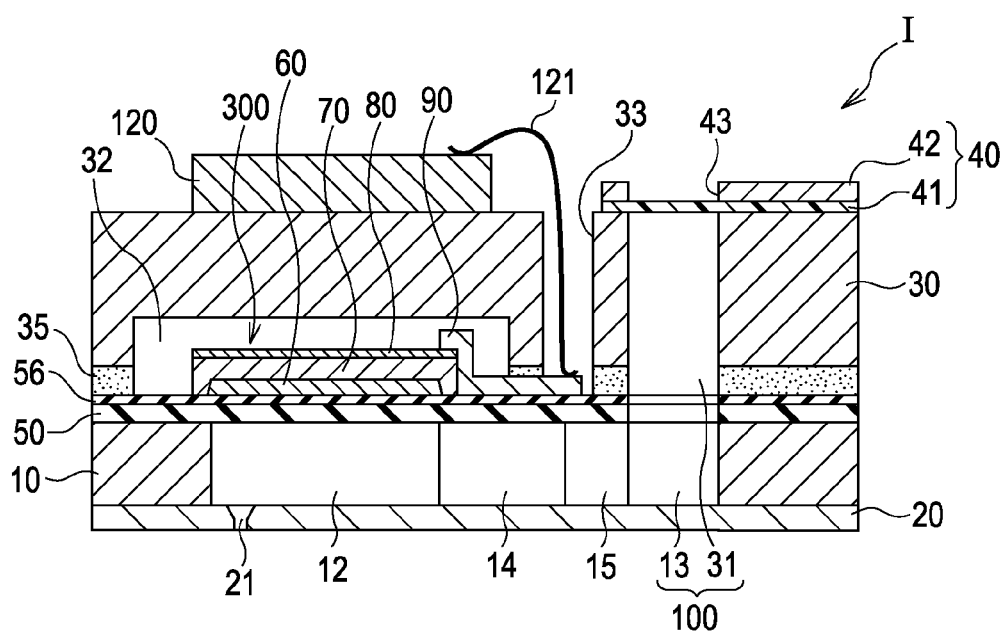
FIG. 3 is a cross-sectional view of the recording head according to Embodiment 1.

FIG. 1 is an exploded perspective view of schematically illustrating the constitution of an ink jet recording head which is an example of the liquid ejecting head according to Embodiment 1 of the invention. FIG. 2 is a plan view of the recording head shown in FIG. 1, and FIG. 3 is a cross-sectional view taken along the line III-III of FIG. 2. As shown in FIGS. 1 to 3, the passage-forming substrate 10 of this embodiment is a single-crystal silicon substrate, and an elastic film 50 of silicon dioxide is disposed on one surface thereof.

The passage-forming substrate 10 is provided with a plurality of pressure-generating chambers 12 arranged in parallel in their width direction. Furthermore, the passage-forming substrate 10 is provided with a communicating portion 13 in an area on an outer side in the longitudinal direction of the pressure-generating chambers 12, and the communicating portion 13 and each pressure-generating chamber 12 are communicated with each other through an ink-supplying path 14 and a communicating path 15 provided to each of the pressure-generating chambers 12. The communicating portion 13 communicates with a manifold portion 31 of a protective substrate described below to constitute a part of the manifold serving as the ink chamber common to all the pressure-generating chambers 12. The ink-supplying path 14 has a width narrower than that of the pressure-generating chamber 12 and maintains a constant flow resistance of the ink flowing in the pressure-generating chamber 12 from the communicating portion 13. Incidentally, in the embodiment, the ink-supplying path 14 is formed by narrowing the width of the flow path from one side, but it may be formed by narrowing the width of the flow path from both sides. Alternatively, the ink-supplying path may be formed by narrowing the flow path from the thickness direction, instead of narrowing the width of the flow path. Therefore, in this embodiment, the passage-forming substrate 10 is provided with a liquid passage composed of the pressure-generating chamber 12, the communicating portion 13, the ink-supplying path 14, and the communicating path 15.

In addition, the passage-forming substrate 10 is bonded to a nozzle plate 20 with, for example, an adhesive or a thermal adhesive film on the opened surface side. The nozzle plate 20 is perforated with nozzle openings 21 that communicate with the corresponding pressure-generating chambers 12 in the vicinity of the ends of the pressure-generating chambers 12 on the side opposite to the ink-supplying path 14. The nozzle plate 20 is made of, for example, a glass ceramic, a single-crystal silicon substrate, or stainless steel.

Furthermore, as described above, the elastic film 50 is disposed on the other side of the passage-forming substrate 10 than the opened surface side. On the elastic film 50, an adhesive layer 56 made of, for example, titanium oxide is disposed to increase the adhesion of a first electrode 60 to a base such as the elastic film 50. Furthermore, an insulating film made of, for example, zirconium oxide, may be disposed between the elastic film 50 and the adhesive layer 56 as necessary.

On the adhesive layer 56, the first electrode 60, a piezoelectric layer 70 that is a thin film having a thickness of 2 μm or less, preferably 0.3 to 1.5 μm, and a second electrode 80 are laminated to constitute a piezoelectric element 300. Herein, the piezoelectric element 300 is a portion including the first electrode 60, the piezoelectric layer 70, and the second electrode 80. In general, one of the electrodes of the piezoelectric element 300 is formed as a common electrode, and the other electrode and the piezoelectric layer 70 are formed by patterning for each pressure-generating chamber 12. In the embodiment, the first electrode 60 is formed as the common electrode of the piezoelectric elements 300, and the second electrode 80 is the individual electrode of each piezoelectric element 300, but these may be reversed depending on a driving circuit or wiring. Furthermore, herein, the piezoelectric element 300 and a diaphragm, which is deformed by driving the piezoelectric element 300, are collectively referred to as an actuator. In the above-mentioned example, the elastic film 50, the adhesive layer 56, the first electrode 60, and the insulating film disposed according to need function as the diaphragm, but the diaphragm is not limited thereto. For example, the elastic film 50 and the adhesive layer 56 may not be provided. Alternatively, the piezoelectric element 300 itself may substantially function as a diaphragm.

In the embodiment, the piezoelectric layer 70 is made of a complex oxide having a perovskite structure containing bismuth (Bi), cerium (Ce), iron (Fe), and cobalt (Co), wherein the molar ratio of cobalt to the total of iron and cobalt is 0.125 or more and 0.875 or less. By doing so, as described below, a leakage current is prevented, and the piezoelectric property is improved. In addition, since lead is not contained, the environmental loads can be reduced. Examples of the complex oxide according to the embodiment include those containing bismuth and cerium in the A site of the perovskite structure and iron and cobalt in the B site.

Bismuth contained in, for example, $BiFeO_3$ tends to volatilize during the production process, in particular, during the calcination of the piezoelectric layer, which has a problem that crystal deficiency of the A site tends to occur. If Bi falls out, at the exact time oxygen is lost for maintaining a balance in the number of electrons. This oxygen defect's presence itself narrows the band gap of the piezoelectric element, which is a direct cause of generating a leakage current. The oxygen defect can be avoided by avoiding Bi defect. As a method for that, it is suggested to add Bi in advance in an amount that is excessive than that of the stoichiometric composition. However, excessive Bi enters not only the A site but also the B site at a certain ratio. The Bi entered the B site serves as an electron supplier, which causes a problem of causing leakage current in the piezoelectric element.

In this embodiment, by containing bismuth and cerium in the A site, even if deficiency has occurred on the position of bismuth, cerium enters the A site to maintain the insulation. That is, a decrease in insulation due to deficiency of bismuth is prevented to make the piezoelectric layer 70 have a high insulating property. By doing so, a leakage current in the piezoelectric element 300 can be prevented. For example, the leakage current of the piezoelectric layer 70 when a voltage of 25 V is applied can be kept to be $1.0 \times 10^{-1}$ $A/cm^2$ or less, preferably $1.0 \times 10^{-3}$ $A/cm^2$ or less. Note that a voltage of 25 V is a typical drive voltage that is applied to each piezoelectric element of ink jet recording heads.

It will be described below that the piezoelectric layer 70 has an excellent insulating property, using bismuth ferrate ($BiFeO_3$) as an example with reference to FIGS. 4 to 6. Note that the following explanation will describe an insulating property by focusing on the A site of a complex oxide.

Figure 4:
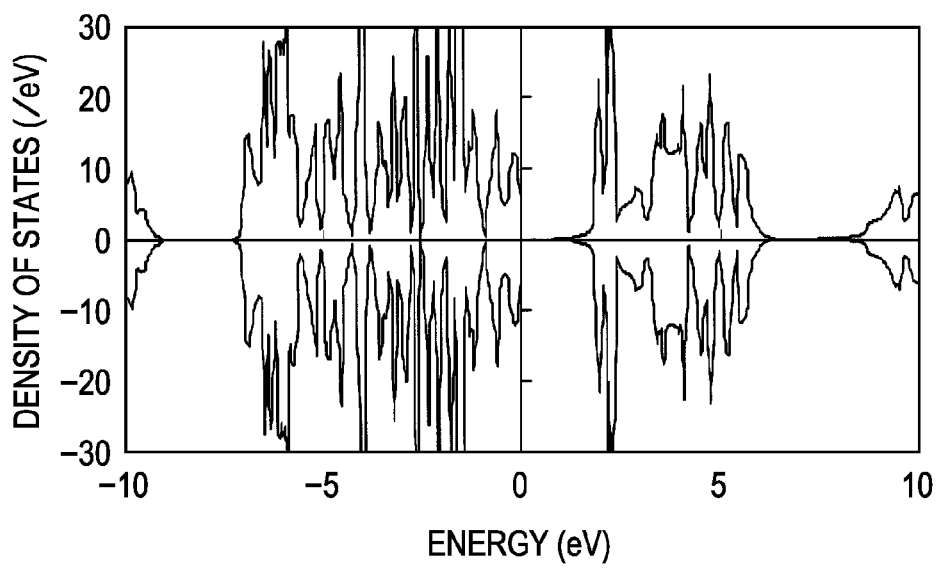
FIG. 4 is a diagram showing the density of states of $BiFeO_3$ in a perfect crystalline state.
Figure 5:
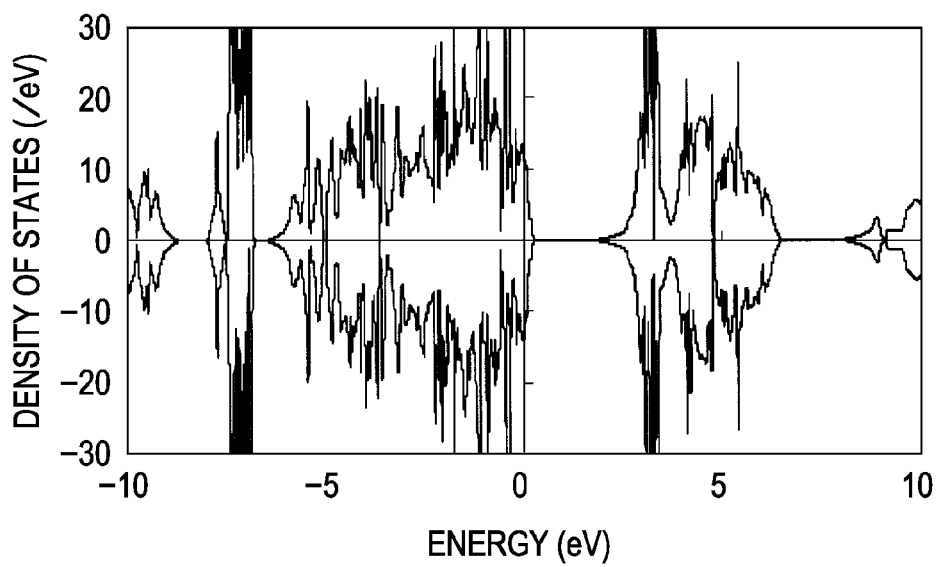
FIG. 5 is a diagram showing the density of states when 12.5% of Bi in $BiFeO_3$ was lost.
Figure 6:
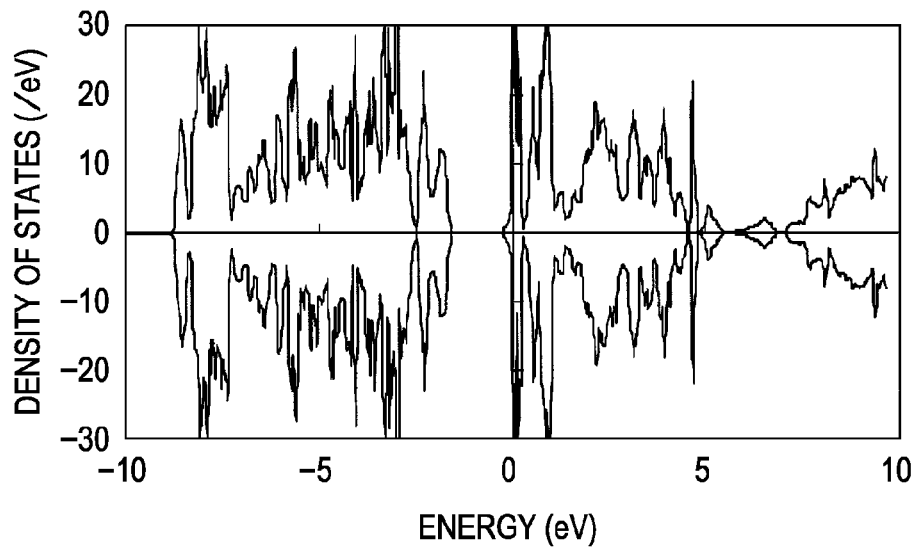
FIG. 6 is a diagram showing the density of states when 12.5% of Bi in $BiFeO_3$ was replaced by Ce.

FIGS. 4 to 6 are diagrams showing the density of states of each crystal determined by using first principle electronic state calculation. The horizontal axis shows the energy difference (eV) of electrons, and the vertical axis shows the density of states (DOS) of electrons. The plus side of the density of states (higher than 0/eV) shows the up-spin, and the minus side shows the down-spin. As the conditions for the first principle electronic state calculation, an ultra-soft pseudopotential based on a density functional method within the range of generalized gradient approximation (GGA) was used. For the transition metal atoms in the B site, in order to take in the strong correlation effect due to d-electron orbital localization, a GGA plus U method (GGA+U method) was used. The cut-off of the wave function and the cut-off of the charge density are respectively 20 hartree and 360 hartree. The super cell of the crystal used for the calculation is composed of $2 \times 2 \times 2$ (=8) $ABO_3$-type perovskite structures. The mesh of the reciprocal lattice point (k point) is ($4 \times 4 \times 4$). Furthermore, the position of each atom is optimized so that the force acting on the atoms is minimized. FIG. 4 is a diagram showing the density of states of bismuth ferrate ($BiFeO_3$) in a perfect crystalline state, FIG. 5 is a diagram showing the density of states when 12.5% of Bi in bismuth ferrate ($BiFeO_3$) was lost, and FIG. 6 is a diagram showing the density of states when 12.5% of Bi in bismuth ferrate ($BiFeO_3$) was replaced by Ce.

The antiferromagnetic states of all systems in the cases shown in FIGS. 4 to 6 were stable.

As shown in FIG. 4, when $BiFeO_3$ is a complete crystal, that is, when there are no holes in both sites and no replacement of Bi by another element, the Fermi level is the top of the valence band to provide an insulating property. Incidentally, the Fermi level is defined as the highest energy level occupied by an electron in one-electron energy obtained by electronic-state simulation.

As shown in FIG. 5, it was confirmed that in $BiFeO_3$, when deficiency is generated by causing loss of a part of bismuth (Bi), peaks project to the plus side than the energy of 0 eV, that is, the Fermi level is within the range of a valence band to lose the insulating property and generate holes to give a p-type. It was confirmed that the area of density of states of the valence band holes (the projection area of peaks in the plus side) obtained by integration is comparable to three electrons. This revealed that bismuth in the crystal system of $BiFeO_3$ contributes as 3+.

Furthermore, as shown in FIG. 6, it was confirmed that when a part of bismuth (Bi) of $BiFeO_3$ is forcedly replaced by cerium, peaks project to the minus side than the energy of 0 eV, that is, the Fermi level is within the range of a conduction band to lose the insulating property to give an n-type. It was confirmed that the area of density of states of the conduction electrons (the projection area of peaks in the minus side) obtained by integration is comparable to one electron. It was confirmed from FIGS. 4 to 6 that cerium contribute as 4+ and functions as an n-type donor.

From the above, it was confirmed that a high insulating property can be maintained by containing bismuth and cerium in the A site, that is, by replacing a part of bismuth by cerium. More specifically, it was confirmed that charge compensation for crystal deficiency of bismuth is performed by cerium to maintain the insulating property. Furthermore, in the above-described example, the insulating property has been described by using $BiFeO_3$ and focusing on the A site, but the behavior, such as the position of Fermi level, is the same in the case that the B site contains cobalt, as described below.

Herein, when the deficiency amount of bismuth is represented by x and the addition amount of cerium is represented by y, the A site can be expressed by $Bi_{1-x}Ce_y$. As proved based on the above-described first principle calculation, bismuth functions as trivalent, and cerium functions as tetravalent. The charge neutrality of the crystal can be maintained by keeping the A site trivalent in total. Therefore, the composition balance of Bi and Ce may satisfy $3(1-x)+4y=3$. That is, when the deficiency amount of Bi is x, cerium may be contained in an amount of $3x/4$. Therefore, for example, a complex oxide satisfying $(Bi_{1-x}, Ce_{3x/4})(Co_{1-\delta}, Fe_\delta)O_3$ can be obtained by adding Ce in an amount of $3x/4$ for the estimated deficiency amount x of Bi during the production process. Under such conditions, even if the number of electrons is decreased by deficiency of Bi, the excessive electrons possessed by added cerium compensate for the decrease to hardly cause oxygen defect. Experimentally, the molar ratio of cerium in the complex oxide to the total of bismuth and cerium is preferably 0.01 or more and 0.13 or less. By doing so, the system can have a higher insulating property and less leakage current compared to a system not containing Ce such as a $BiFeO_3$ system complex system.

The complex oxide may contain lanthanum in the A site. Appearance of a hetero phase other than the perovskite structure is prevented by containing lanthanum. Since lanthanum is a metal having an ionic valence of 3+, the presence of this metallic element in the A site does not change the "valence balance" of the invention and does not adversely affect the leakage current conditions. The molar ratio of lanthanum contained in the A site is 0.05 or more and 0.20 or less with respect to the total of bismuth, cerium, and lanthanum.

The complex oxide contains bismuth (Bi) in the A site and iron (Fe) and cobalt (Co) in the B site in a molar ratio of cobalt to the total of iron and cobalt of 0.125 or more and 0.875 or less. Thus, in the embodiment, the complex oxide constituting the piezoelectric layer 70 contains iron and cobalt, which have different atomic radii from each other, in the B site position at a certain ratio, and, thereby, the insulating property and the magnetic property can be maintained. In addition, since such a complex oxide has a morphotropic phase boundary (MPB), the piezoelectric layer 70 can have an excellent piezoelectric property. In particular, when the molar ratio of cobalt to the total of iron and cobalt is approximately 0.5, for example, the piezoelectric constant is increased to provide a particularly excellent piezoelectric property.

Figure 7:
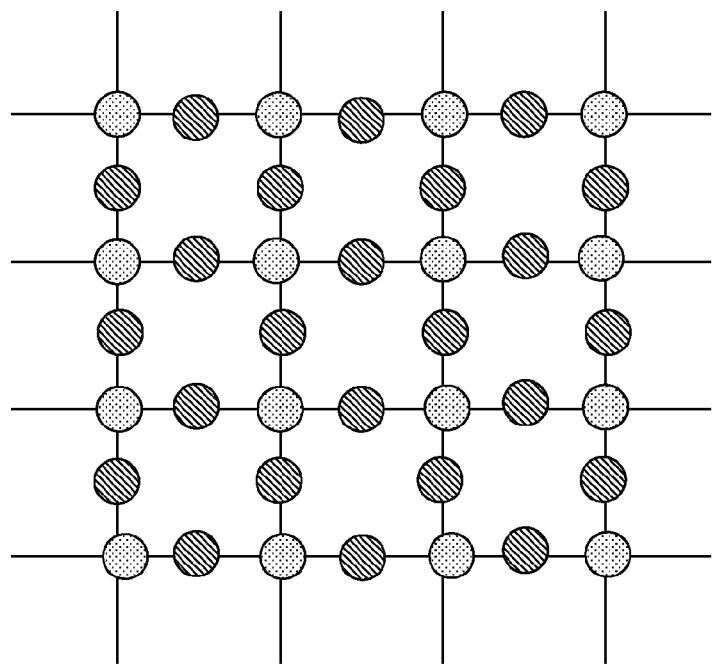
FIG. 7 is a schematic diagram of a complex oxide crystal having a perovskite structure.

FIG. 7 is a schematic diagram of a complex oxide crystal having a perovskite structure. Iron and cobalt contained in the B site of the complex oxide according to the embodiment have magnetic properties. As shown in FIG. 7, in the complex oxide having a perovskite structure of the embodiment, the antiferromagnetic structure is maintained by a magnetic network of iron or cobalt, which is a metal in the B site, and oxygen.

Furthermore, the piezoelectric layer 70 of the embodiment has a monoclinic crystalline structure. That is, the piezoelectric layer 70 made of a complex oxide having a perovskite structure has monoclinic symmetry. Such a piezoelectric layer 70 can obtain a high piezoelectric property. The reason thereof is thought that, in such a structure, the polarization moment of the piezoelectric layer easily rotates by an electric field applied in the direction perpendicular to a plane. In the piezoelectric layer, the amount of a change in the polarization moment and the amount of a change in the crystal structure are directly linked to each other to exactly provide a piezoelectric property. From the above, in a structure in which a change in the polarization moment tends to occur, a high piezoelectric property can be obtained.

The piezoelectric layer 70 is preferably in an engineered domain arrangement in which the polarization direction is tilted at a certain angle (50 to 60 degrees) with respect to the vertical direction of the film plane (the thickness direction of the piezoelectric layer 70).

Each second electrode 80, which is the individual electrode of the piezoelectric element 300, is connected to a lead electrode 90 made of, for example, gold (Au) that is drawn out from the vicinity of the end on the ink-supplying path 14 side and extends on the elastic layer 56.

Above the passage-forming substrate 10 provided with such piezoelectric elements 300, that is, above the first electrode 60, the adhesive layer 56, and the lead electrodes 90, a protective substrate 30 having the manifold portion 31 constituting at least a part of a manifold 100 is bonded with an adhesive 35. In the embodiment, the manifold portion 31 is formed along the width direction of the pressure-generating chambers 12 so as to pass through the protective substrate 30 in the thickness direction and communicates with the communicating portion 13 of the passage-forming substrate 10 to constitute the manifold 100 serving as a common ink chamber for the pressure-generating chambers 12. Alternatively, the communicating portion 13 of the passage-forming substrate 10 may be divided so as to correspond to each pressure-generating chamber 12, and only the manifold portion 31 may serve as the manifold. Furthermore, for example, the passage-forming substrate 10 may be provided with only the pressure-generating chambers 12, and members (for example, the elastic film 50 and the adhesive layer 56) interposed between the passage-forming substrate 10 and the protective substrate 30 may be provided with the ink-supplying paths 14 communicating with the manifold 100 and the corresponding pressure-generating chambers 12.

The protective substrate 30 is provided with a piezoelectric element holding portion 32, at the area facing the piezoelectric elements 300, having a space that is enough not to hinder the movement of the piezoelectric elements 300. The space of the piezoelectric element holding portion 32 may be sealed or not be sealed as long as it is enough not to hinder the movement of the piezoelectric elements 300.

The protective substrate 30 is preferably made of a material having almost the same coefficient of thermal expansion as that of the passage-forming substrate 10, for example, made of a glass or ceramic material. In this embodiment, the protective substrate 30 is a single-crystal silicon substrate, which is the same material as that of the passage-forming substrate 10.

The protective substrate 30 is provided with a through-hole 33 passing through the protective substrate 30 in the thickness direction. The through-hole 33 is formed so that the vicinity of the end of the lead electrode 90 drawn out from each piezoelectric element 300 is exposed in the through-hole 33.

Furthermore, a driving circuit 120 for driving the piezoelectric elements 300 arranged parallel is fixed on the protective substrate 30. The driving circuit 120 may be, for example, a circuit board or a semiconductor integrated circuit (IC). The driving circuit 120 and the lead electrodes 90 are electrically connected to each other through connecting wire 121 made of conductive wire such as bonding wire.

In addition, a compliance substrate 40 composed of a sealing film 41 and a fixing plate 42 is bonded on the protective substrate 30. Herein, the sealing film 41 is formed of a flexible material having a low rigidity and seals one side of the manifold portion 31. The fixing plate 42 is formed of a relatively hard material. The fixing plate 42 is provided with an opening 43 by completely removing the fixing plate 42 at the area facing the manifold 100 in the thickness direction. Therefore, the one side of the manifold 100 is sealed with only the sealing film 41 having flexibility.

In such an ink jet recoding head I of the embodiment, ink is fed through an ink inlet connected to exterior ink supplying means (not shown) to fill the inside from the manifold 100 to the nozzle openings 21 with ink. Then, a voltage is applied between the first electrode 60 and the second electrode 80 corresponding to each pressure-generating chamber 12 according to a recording signal from the driving circuit 120 to flexurally deform the elastic film 50, the adhesive layer 56, the first electrode 60, and the piezoelectric layer 70. Thereby, the pressure in each pressure-generating chamber 12 is increased, and ink droplets are discharged from the nozzle opening 21.

Then, an example of the process of producing the piezoelectric element of the ink jet recoding head of the embodiment will be described with reference to FIGS. 8A, 8B, 9A to 9C, 10A, 10B, 11A to 11C, 12A, and 12B.

Figure 8A:
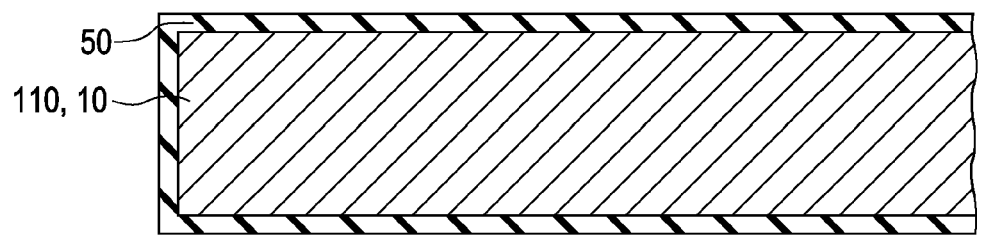
FIG. 8A is a cross-sectional view of a recording head in its production process according to Embodiment 1.
Figure 8B:
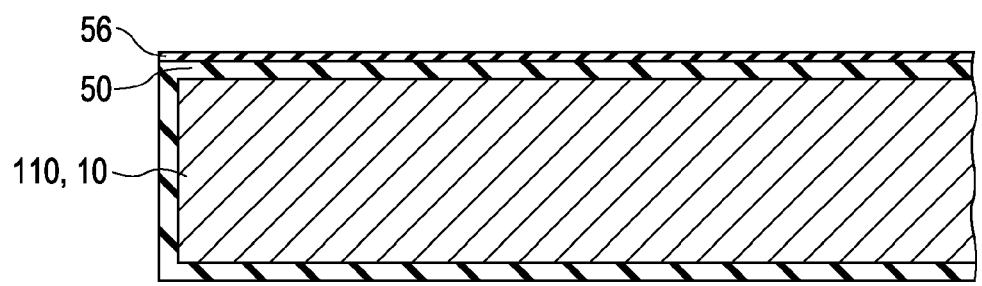
FIG. 8B is a cross-sectional view of the recording head in its production process according to Embodiment 1.

First, as shown in FIG. 8A, a silicon dioxide film of, for example, silicon dioxide ($SiO_2$), constituting the elastic film 50 is formed on the surface of a silicon wafer as the passage-forming substrate wafer 110 by, for example, thermal oxidization. Then, as shown in FIG. 8B, an adhesive layer 56 of, for example, titanium oxide is formed on the elastic film 50 (silicon dioxide film) by, for example, reactive sputtering or thermal oxidation.

Figure 9A:
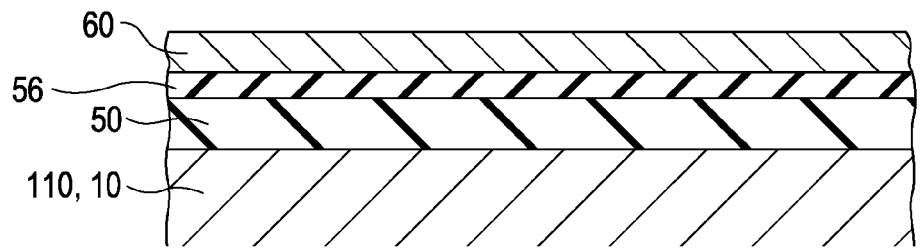
FIG. 9A is a cross-sectional view of the recording head in its production process according to Embodiment 1.

Then, as shown in FIG. 9A, a first electrode 60 is formed on the adhesive layer 56. Specifically, a first electrode 60 made of platinum, iridium, iridium oxide, or a layered structure thereof is formed on the adhesive layer 56. The adhesive layer 56 and the first electrode 60 can be formed by, for example, sputtering or vapor deposition.

Then, a piezoelectric layer 70 is laminated on the first electrode 60. The process of producing the piezoelectric layer 70 is not particularly limited, but, for example, the piezoelectric layer 70 can be formed by a metal-organic decomposition (MOD) method, in which a piezoelectric layer 70 of a metal oxide is produced by dissolving/dispersing an organometallic compound in a solvent and applying and drying the solution and firing it at high temperature, or by chemical solution deposition such as a sol-gel method. The piezoelectric layer 70 may be formed by another method, such as a laser ablation method, a sputtering method, a pulse laser deposition method (PLD method), a CVD method, or an aerosol deposition method.

Figure 9B:
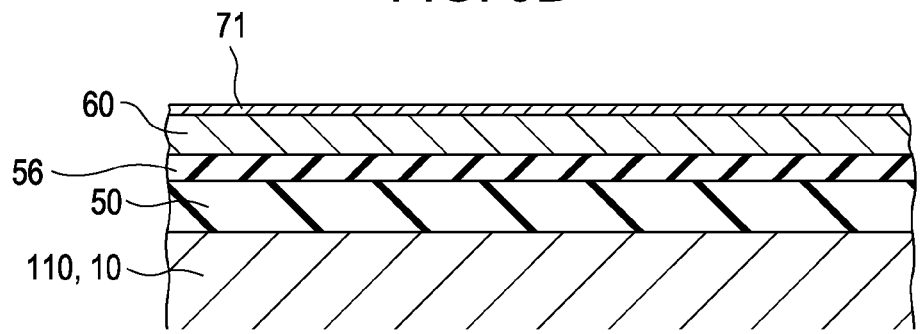
FIG. 9B is a cross-sectional view of the recording head in its production process according to Embodiment 1.

In a specific example of the procedure for forming the piezoelectric layer 70, first, as shown in FIG. 9B, on the first electrode 60, a sol or an MOD solution (precursor solution) containing organometallic compounds, specifically, organometallic compounds containing Bi, Ce, Fe, Co, and, as necessary, La at a ratio so as to give a target composition ratio is applied by, for example, spin coating to form a piezoelectric precursor film 71 (application step).

The precursor solution to be applied is prepared by mixing organometallic compounds that can form a complex oxide containing Bi, Ce, Fe, and Co at desired molar ratios and dissolving or dispersing the mixture in an organic solvent such as alcohol. On this occasion, the addition amount of cerium is adjusted to an amount of 3x/4 for the estimated deficiency amount x of Bi.

Herein, the phrase "organometallic compounds that can form a complex oxide containing Bi, Ce, Fe, and Co" refers to a mixture of organometallic compounds each containing at least one metal selected from Bi, Ce, Fe, and Co. The organometallic compound may contain La. As the organometallic compounds respectively containing Bi, Ce, Fe, Co, and La, for example, metal alkoxides, organic acid salts, and β-diketone complexes can be used. Examples of the organometallic compound containing Bi include bismuth 2-ethylhexanoate. Examples of the organometallic compound containing Fe include iron 2-ethylhexanoate. Examples of the organometallic compound containing Ce include cerium 2-ethylhexanoate. Examples of the organometallic compound containing Co include cobalt 2-ethylhexanoate. Examples of the organometallic compound containing La include lanthanum 2-ethylhexanoate. An organometallic compound containing two or more of Bi, Ce, Fe, Co, and La may be used.

Then, the piezoelectric precursor film 71 is heated at a predetermined temperature for a predetermined time for drying (drying step). Subsequently, the dried piezoelectric precursor film 71 is heated to a predetermined temperature and is kept at the temperature for a predetermined period of time for degreasing (degreasing step). Herein, the term "degreasing" means that organic components contained in the piezoelectric precursor film 71 are eliminated as, for example, $NO_2$, $CO_2$, or $H_2O$. The atmospheres for the drying step and the degreasing step are not limited, and these steps may be performed in the air or in an inert gas.

Figure 9C:
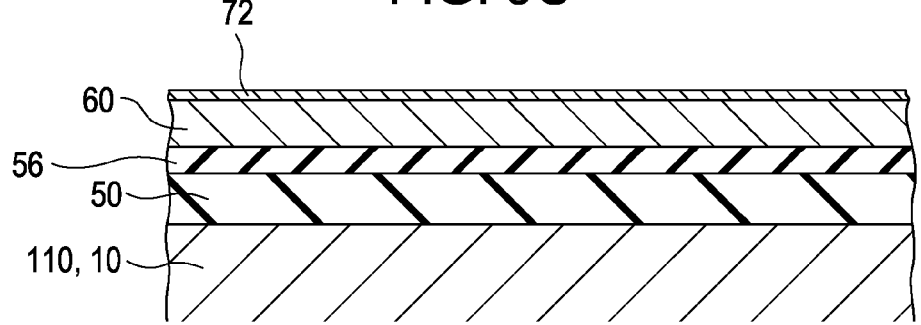
FIG. 9C is a cross-sectional view of the recording head in its production process according to Embodiment 1.

Then, as shown in FIG. 9C, the piezoelectric precursor film 71 is heated to a predetermined temperature, for example, about 600 to 800° C., and is kept at the temperature for a predetermined period of time for crystallization to form a piezoelectric film 72 (firing step). The atmosphere for the firing step is also not limited, and the step may be performed in the air or in an inert gas.

As the heating apparatus used in the drying step, the degreasing step, or the firing step, for example, a rapid thermal annealing (RTA) apparatus performing heating by irradiation with an infrared lamp or a hot plate can be used.

Figure 10A:
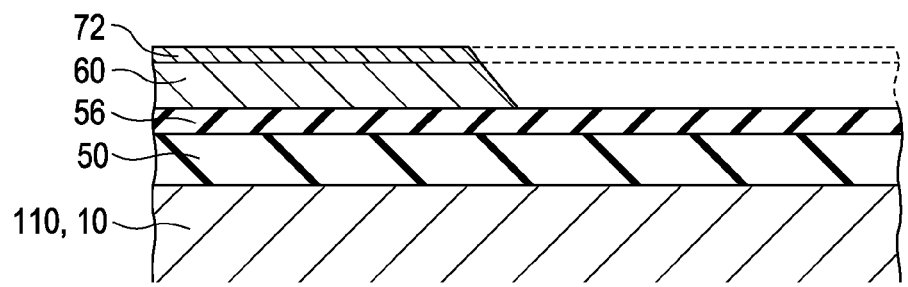
FIG. 10A is a cross-sectional view of the recording head in its production process according to Embodiment 1.

Then, as shown in FIG. 10A, the first electrode 60 and the first layer of the piezoelectric film 72 are simultaneously patterned so as to have an incline at their side faces using a resist (not shown) having a predetermined shape as a mask on the piezoelectric film 72.

Figure 10B:
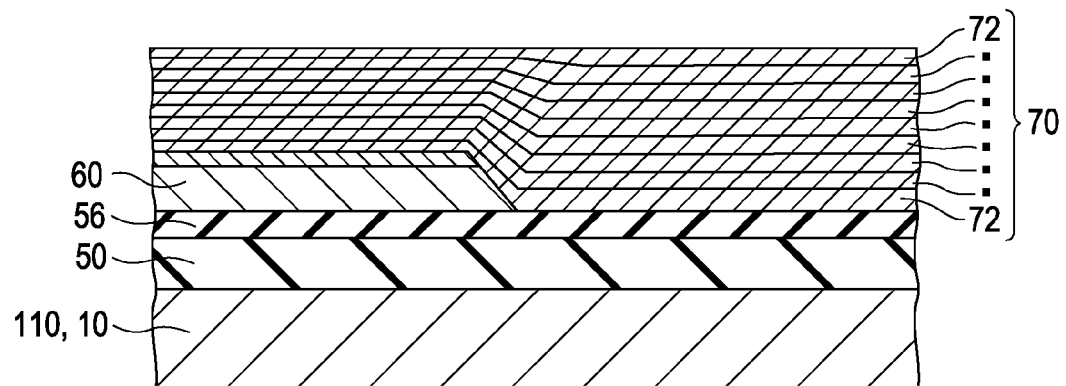
FIG. 10B is a cross-sectional view of the recording head in its production process according to Embodiment 1.

Then, after removal of the resist, a piezoelectric layer 70 composed of a plurality of the piezoelectric films 72, as shown in FIG. 10B, and having a predetermined thickness is formed by repeating more than once the application step, the drying step, and the degreasing step, or the application step, the drying step, the degreasing step, and the firing step, according to a desired thickness, etc. For example, when the thickness of each application of a solution is about 0.1 μm, the total thickness of the piezoelectric layer 70 composed of, for example, ten layers of the piezoelectric films 72 is about 1.1 μm. In this embodiment, the piezoelectric layer 70 is a laminated layer of the piezoelectric films 72, but may be a single layer.

Figure 11A:
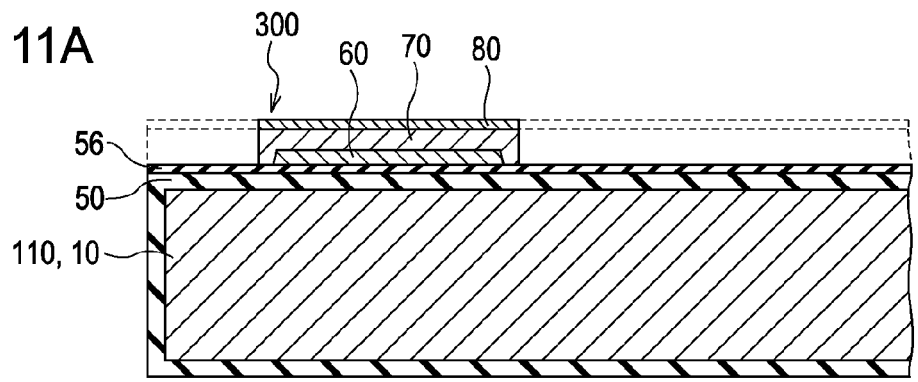
FIG. 11A is a cross-sectional view of the recording head in its production process according to Embodiment 1.

After thus forming the piezoelectric layer 70, as shown in FIG. 11A, a second electrode 80 of, for example, platinum is formed on the piezoelectric layer 70 by sputtering. Subsequently, the piezoelectric layer 70 and the second electrode 80 are simultaneously patterned in the area corresponding to the pressure-generating chambers 12 to form piezoelectric elements 300 each composed of the first electrode 60, the piezoelectric layer 70, and the second electrode 80. The patterning of the piezoelectric layer 70 and the second electrode 80 can be performed at once by dry etching through a resist (not shown) having a predetermined shape. Then, according to necessary, post annealing may be performed in a temperature range of 600 to 800° C. By doing so, the interface between the piezoelectric layer 70 and the first electrode 60 or the second electrode 80 can be improved, and also the crystallinity of the piezoelectric layer 70 can be improved.

Figure 11B:
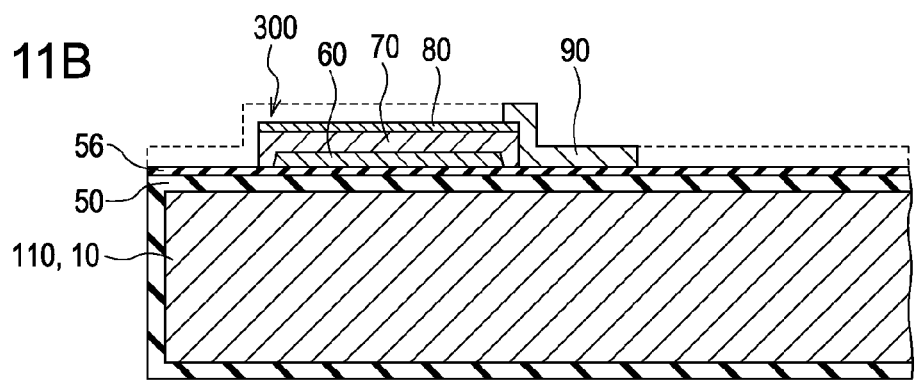
FIG. 11B is a cross-sectional view of the recording head in its production process according to Embodiment 1.

Then, as shown in FIG. 11B, a lead electrode 90 of, for example, gold (Au) is formed on the entire surface of the passage-forming substrate wafer 110 and then is patterned through a mask pattern (not shown) of a resist or the like to form the lead electrodes 90 corresponding to the respective piezoelectric elements 300.

Figure 11C:
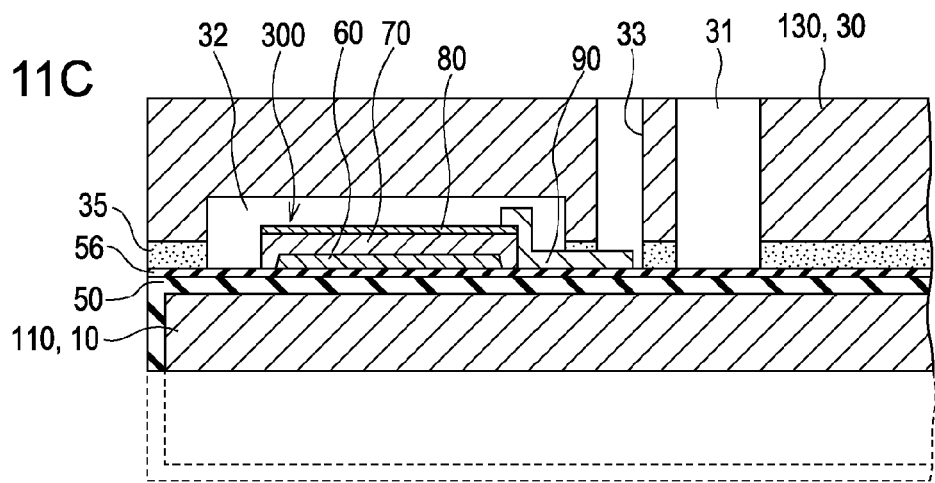
FIG. 11C is a cross-sectional view of the recording head in its production process according to Embodiment 1.

Then, as shown in FIG. 11C, a protective substrate wafer 130 that is a silicon wafer for forming a plurality of protective substrates 30 is bonded to the passage-forming substrate wafer 110 on the piezoelectric elements 300 side with an adhesive 35, and, subsequently, the passage-forming substrate wafer 110 is thinned to a predetermined thickness.

Figure 12A:
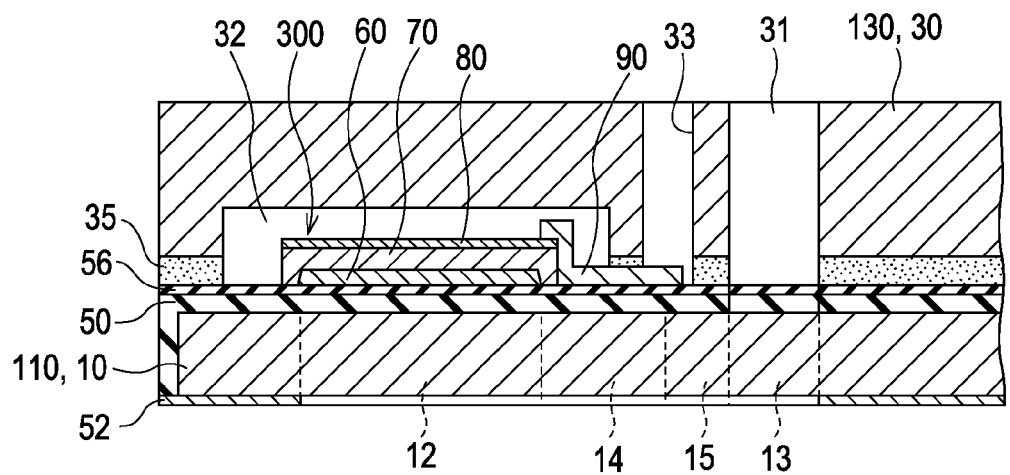
FIG. 12A is a cross-sectional view of the recording head in its production process according to Embodiment 1.

Subsequently, as shown in FIG. 12A, a new mask film 52 is formed on the passage-forming substrate wafer 110 and patterned into a predetermined shape.

Figure 12B:
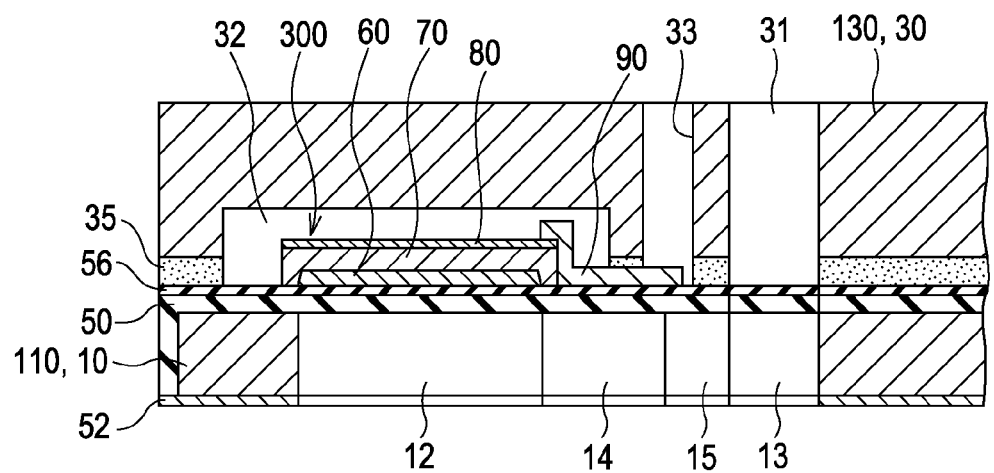
FIG. 12B is a cross-sectional view of the recording head in its production process according to Embodiment 1.

Then, as shown in FIG. 12B, the passage-forming substrate wafer 110 is anisotropically etched (wet-etched) using an alkaline solution, such as KOH, through the mask film 52 to form the pressure-generating chambers 12, the communicating portion 13, the ink-supplying paths 14, and the communicating paths 15 corresponding to the piezoelectric elements 300.

Then, unneeded portions at the outer peripheral portions of the passage-forming substrate wafer 110 and the protective substrate wafer 130 are removed by cutting, e.g., by dicing. The mask film 52 on the opposite side of the passage-forming substrate wafer 110 from the protective substrate wafer 130 is removed. Subsequently, a nozzle plate 20 perforated with nozzle openings 21 is bonded to the passage-forming substrate wafer 110, and a compliance substrate 40 is bonded to the protective substrate wafer 130, and the passage-forming substrate wafer 110 and other associated components are divided into individual chip-sized passage-forming substrates 10 and other components as shown in FIG. 1 to give the ink jet recording head I of the embodiment.

Other Embodiment

An embodiment according to an aspect of the invention has been described above, but the basic constitution of the invention is not limited thereto. For example, in the above-described embodiment, a single-crystal silicon substrate is used as the passage-forming substrate 10, but the passage-forming substrate 10 is not limited thereto and may be, for example, a SOI substrate or a glass substrate.

In addition, in the above-described embodiment, as an example, the piezoelectric elements 300 are formed by sequentially laminating a first electrode 60, a piezoelectric layer 70, and a second electrode 80 on a substrate (passage-forming substrate 10), but is not particularly limited thereto. The invention can be applied to, for example, a longitudinal vibration-type piezoelectric element that extends and contracts in the axial direction by alternately laminating a piezoelectric material and an electrode-forming material.

Figure 13:
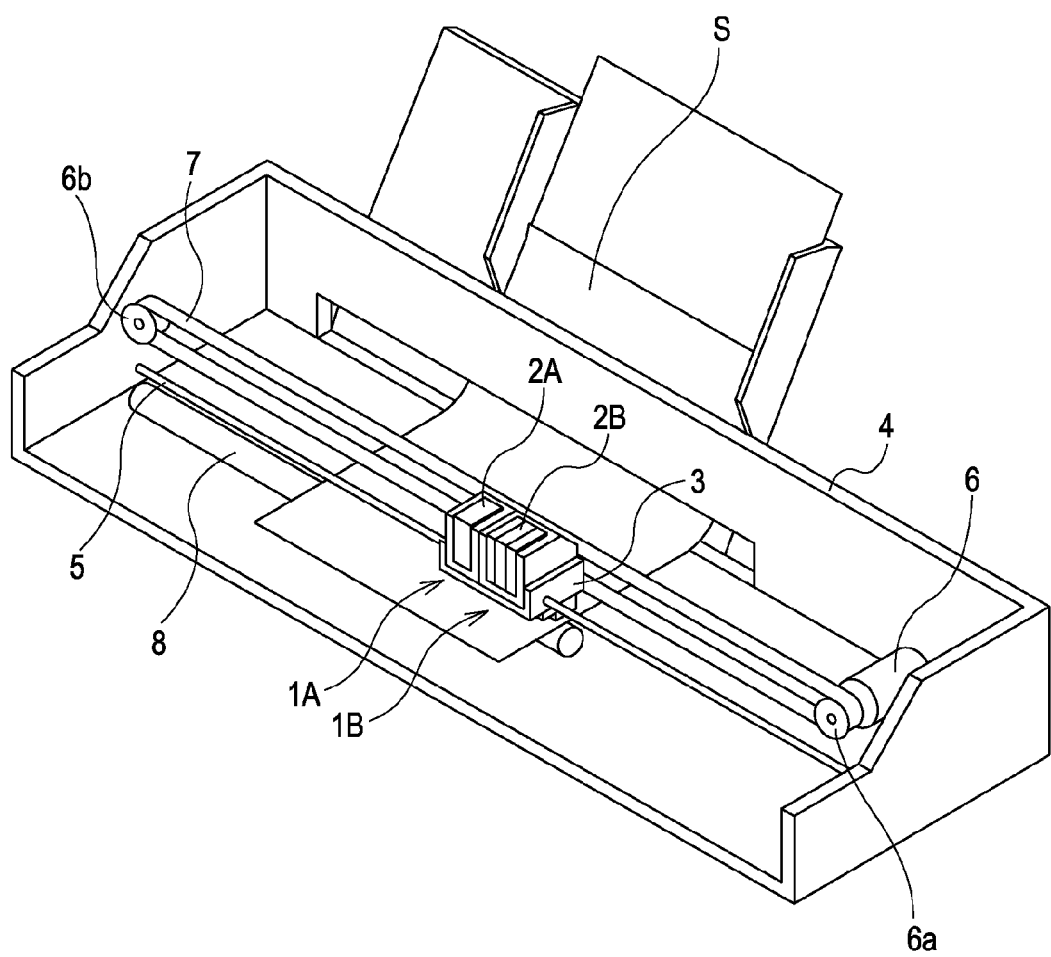
FIG. 13 is a view schematically showing the constitution of a recoding apparatus according to an embodiment of an aspect of the invention.

The ink jet recording head of the embodiment constitutes a part of a recording head unit including an ink flow path that communicates with, for example, an ink cartridge and is mounted on an ink jet recording apparatus. FIG. 13 is a schematic view showing an example of the ink jet recording apparatus.

As shown in FIG. 13, the recording head units 1A and 1B including the ink jet recording heads I are detachably provided with cartridges 2A and 2B constituting ink supplying means. A carriage 3 on which the recording head units 1A and 1B are mounted is set to a carriage axis 5, which is fixed to an apparatus body 4, in a manner that the carriage 3 is movable in the axial direction. The recording head units 1A and 1B discharge, for example, a black ink composition and a color ink composition, respectively.

Driving force of a driving motor 6 is transferred to the carriage 3 through a plurality of gears (not shown) and a timing belt 7, and thereby the carriage 3, on which the recording head units 1A and 1B are mounted, is moved along the carriage axis 5. The apparatus body 4 is provided with a platen 8 along the carriage axis 5, and a recording sheet S, serving as a recording medium such as paper, is fed by, for example, a feeding roller (not shown) and is wrapped around the platen 8 and thereby transported.

In the example shown in FIG. 13, the ink jet recording head units 1A and 1B each have one ink jet recording head I, but are not particularly limited thereto. For example, one ink jet recording head unit 1A or 1B may have two or more ink jet recording heads.

In the above-described embodiment, an ink jet recording head has been described as an example of the liquid ejecting head, but the invention broadly covers general liquid ejecting heads and can be applied to liquid ejecting heads that eject liquid other than ink. Examples of the other liquid ejecting heads include various types of recording heads used in image recording apparatuses such as printers, coloring material ejecting heads used for producing color filters of, for example, liquid crystal displays, electrode material ejecting heads used for forming electrodes of, for example, organic EL displays or field emission displays (FEDs), and bio-organic material ejecting heads used for producing bio-chips.

Since the piezoelectric element of the invention shows a good insulating property and a good piezoelectric property, as described above, it can be applied to piezoelectric elements of liquid ejecting heads represented by ink jet recording heads, but the application is not limited thereto. For example, the piezoelectric element can be applied to piezoelectric elements of, for example, ultrasonic devices such as ultrasonic transmitters, ultrasonic motors, piezoelectric transformers, and various types of sensors such as infrared sensors, ultrasonic sensors, thermal sensors, pressure sensors, and pyroelectric sensors. In addition, the invention can be similarly applied to ferroelectric devices such as ferroelectric memories.

What is claimed is:

1. A piezoelectric element comprising:
a piezoelectric layer and electrodes provided to the piezoelectric layer,
wherein the piezoelectric layer includes a complex oxide containing bismuth, cerium, iron, and cobalt, wherein a molar ratio of the cerium to a total of the bismuth and the cerium is 0.01 or more and 0.13 or less.

2. The piezoelectric element according to claim 1, wherein the piezoelectric layer a molar ratio of the cobalt to the total of the iron and the cobalt is 0.125 or more and 0.875 or less.

3. The piezoelectric element according to claim 1, wherein the complex oxide is represented by the following formula:

$$(Bi_{1-x}, Ce_{3x/4})(Co_{1-\delta}, Fe_{\delta})O_3 \qquad (1).$$

4. The piezoelectric element according to claim 1, wherein the piezoelectric layer has a monoclinic crystalline structure.

5. The piezoelectric element according to claim 1, wherein the complex oxide further contains lanthanum.

6. The piezoelectric element according to claim 5, wherein the complex oxide contains lanthanum at a molar ratio of 0.05 or more and 0.20 or less with respect to the total of bismuth, cerium, and lanthanum.

7. A liquid ejecting head comprising the piezoelectric element according to claim 1.

8. A liquid ejecting apparatus comprising the liquid ejecting head according to claim 7.

* * * * *